United States Patent
Sekine et al.

(10) Patent No.: US 10,615,205 B2
(45) Date of Patent: Apr. 7, 2020

(54) IMAGING APPARATUS, IMAGING SYSTEM, AND MOVING BODY

(71) Applicant: CANON KABUSHIKI KAISHA, Tokyo (JP)

(72) Inventors: Hiroshi Sekine, Kawagoe (JP); Yusuke Onuki, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 141 days.

(21) Appl. No.: 15/982,975

(22) Filed: May 17, 2018

(65) Prior Publication Data

US 2018/0342550 A1 Nov. 29, 2018

(30) Foreign Application Priority Data

May 26, 2017 (JP) .................................. 2017-104934

(51) Int. Cl.
*H04N 5/359* (2011.01)
*H01L 27/146* (2006.01)
*G05D 1/02* (2020.01)
*H04N 5/3745* (2011.01)

(52) U.S. Cl.
CPC ..... *H01L 27/14625* (2013.01); *G05D 1/0246* (2013.01); *H01L 27/14612* (2013.01); *H01L 27/14623* (2013.01); *H04N 5/359* (2013.01); *H04N 5/37452* (2013.01)

(58) Field of Classification Search
CPC ......... H01L 27/14625; H01L 27/14612; H01L 27/14623; G05D 1/0246; H04N 5/359
USPC ......................................................... 348/148
See application file for complete search history.

(56) References Cited

FOREIGN PATENT DOCUMENTS

JP 2011238949 A 11/2011
JP 2014049575 A 3/2014
JP 2015176969 A 10/2015

*Primary Examiner* — Nguyen T Truong
(74) *Attorney, Agent, or Firm* — Canon U.S.A. Inc., IP Division

(57) ABSTRACT

An imaging apparatus includes a plurality of pixels each including a photoelectric conversion unit and a charge holding unit configured to hold an electric charge generated in the photoelectric conversion unit, a waveguide disposed above the photoelectric conversion unit, and a light blocking unit configured to cover the charge holding unit, wherein a width of a bottom surface of the waveguide is smaller than 1.1 μm.

25 Claims, 9 Drawing Sheets

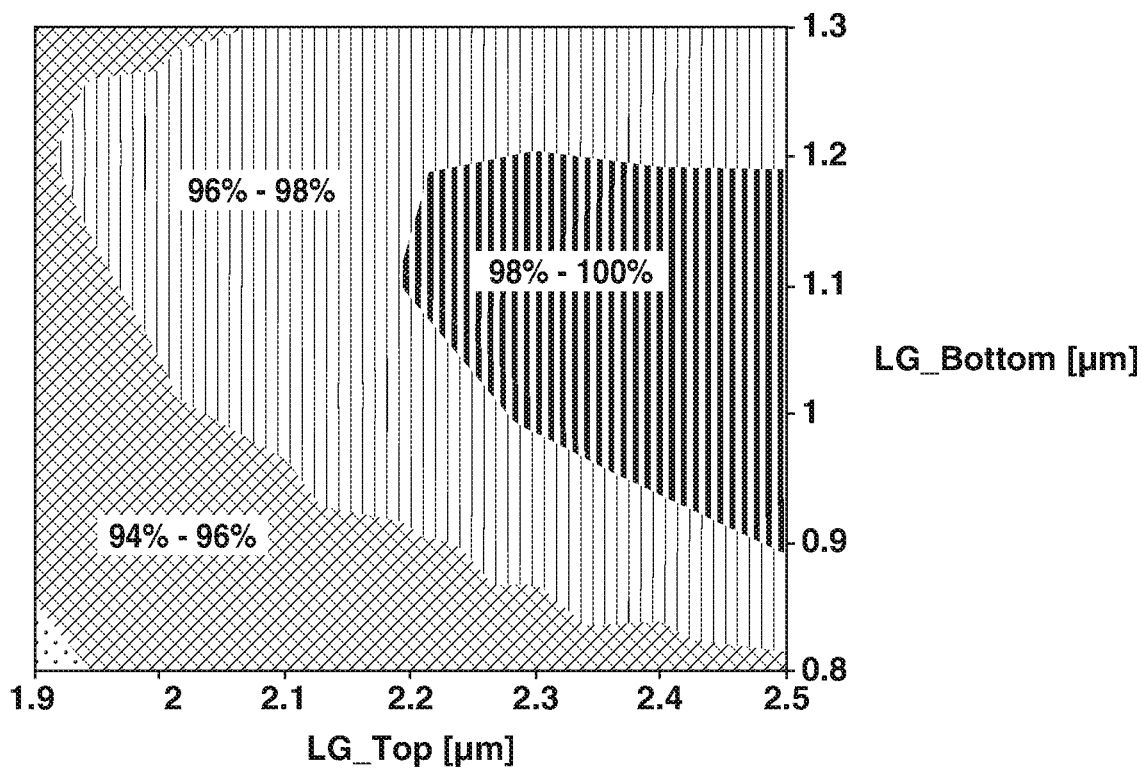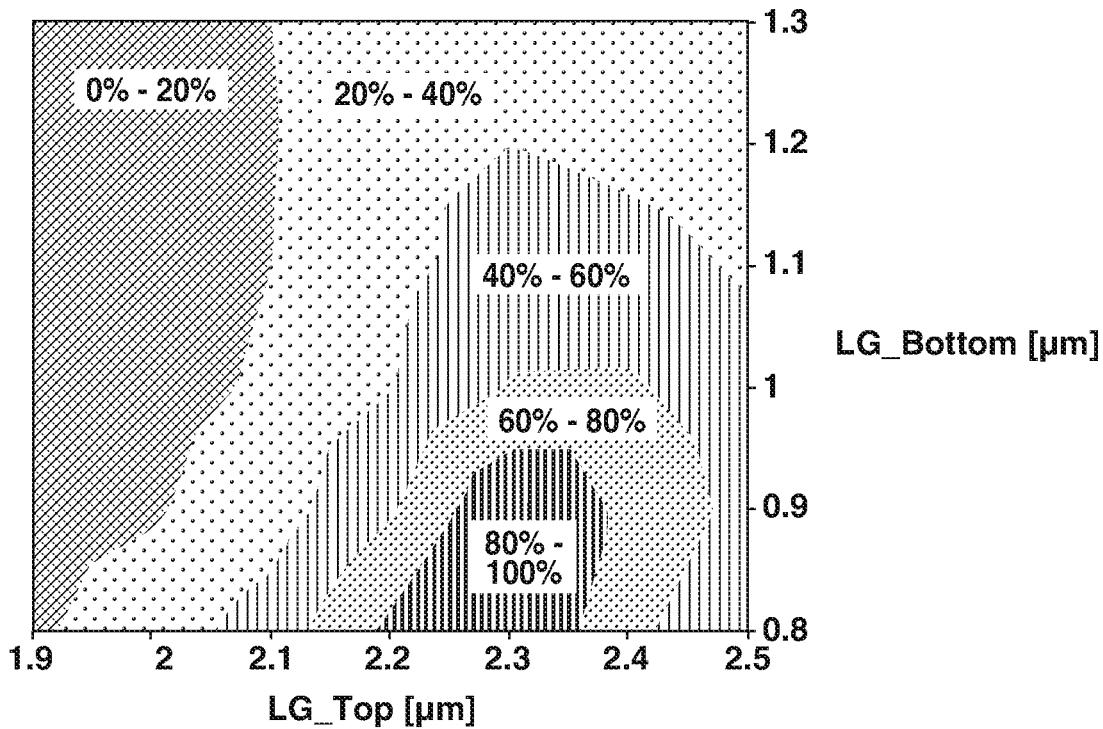

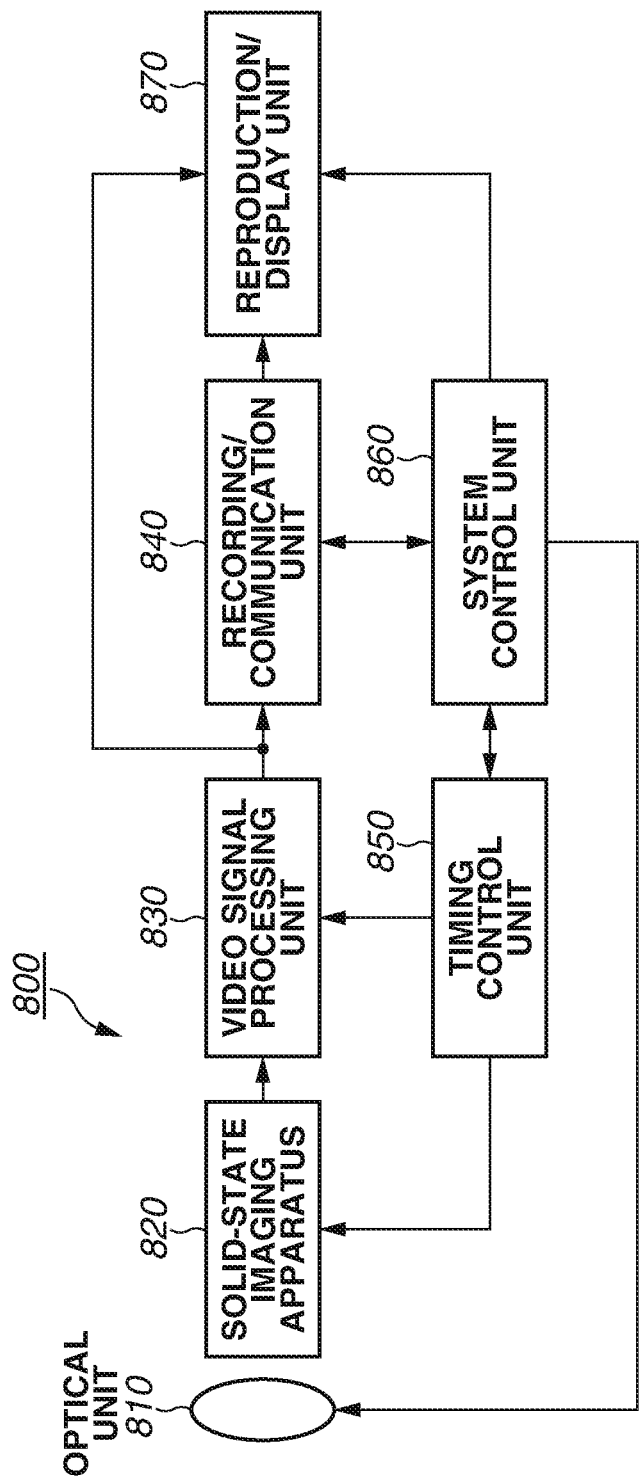

IMAGING APPARATUS, IMAGING SYSTEM, AND MOVING BODY

BACKGROUND OF THE INVENTION

Field of the Invention

The present disclosure relates to an imaging apparatus, an imaging system, and a moving body.

Description of the Related Art

Japanese Patent Application Laid-Open No. 2011-238949, Japanese Patent Application Laid-Open No. 2014-049575, and Japanese Patent Application Laid-Open No. 2015-176969 discuss imaging apparatuses including a plurality of pixels each including a photoelectric conversion unit and a charge holding unit to which an electric charge is transferred from the photoelectric conversion unit. The charge holding unit is covered by a light blocking unit. Since each pixel includes the charge holding unit shielded from light, these imaging apparatuses can achieve a shutter operation for simultaneously accumulating electric charges of all the pixels, i.e., a global electronic shutter operation.

Above each photoelectric conversion unit, an optical waveguide for collecting light in the photoelectric conversion unit is provided. The optical waveguide improves the efficiency of light collection in the photoelectric conversion unit. Thus, it is possible to improve sensitivity.

SUMMARY OF THE INVENTION

According to an aspect of the present disclosure, an imaging apparatus includes a plurality of pixels each including a photoelectric conversion unit and a charge holding unit configured to hold an electric charge generated in the photoelectric conversion unit, a waveguide disposed above the photoelectric conversion unit, and a light blocking unit configured to cover the charge holding unit, wherein a width of a bottom surface of the waveguide is smaller than 1.1 µm.

According to another aspect of the present disclosure, an imaging apparatus includes a plurality of pixels each including a photoelectric conversion unit and a charge holding unit configured to hold an electric charge generated in the photoelectric conversion unit, a waveguide disposed above the photoelectric conversion unit, and a light blocking unit configured to cover the charge holding unit, wherein a width of a bottom surface of the waveguide is 32.0% or less of a pixel pitch at which the plurality of pixels are arranged.

Further features of the present disclosure will become apparent from the following description of exemplary embodiments with reference to the attached drawings.

BRIEF DESCRIPTION OF THE DRAWINGS

FIG. 5A is a diagram illustrating sensitivity regarding a waveguide of the imaging apparatus according to the first exemplary embodiment, and FIG. 5B is a diagram illustrating a simulation result of light blocking performance regarding the waveguide.

FIG. 7 is a block diagram illustrating an imaging system according to a third exemplary embodiment.

DESCRIPTION OF THE EMBODIMENTS

According to imaging apparatuses according to some exemplary embodiments, it is possible to suppress noise. If light is incident on a charge holding unit, an electric charge may be generated in the charge holding unit. The electric charge generated in the charge holding unit can cause noise. For example, in a case where a global electronic shutter operation is performed, the time from the end of an exposure period to the reading of an electric charge of the charge holding unit differs depending on the row. Thus, if light is incident on the charge holding unit, shading may occur in an image.

Japanese Patent Application Laid-Open No. 2011-238949 and Japanese Patent Application Laid-Open No. 2014-049575 illustrate examples of the schematic cross-sectional structure of an optical waveguide and a light blocking unit. However, the positional relationship between the optical waveguide and the light blocking unit is not quantitatively examined. In Japanese Patent Application Laid-Open No. 2015-176969, the relationship between the heights of an optical waveguide and a light blocking unit is examined. However, in the publication of Japanese Patent Application Laid-Open No. 2015-176969 as well, the sizes of incidence and exit surfaces of the optical waveguide are not examined. The present inventors have found that the light blocking performance of a light blocking unit greatly varies depending on the size of an incidence surface of an optical waveguide. That is, in the conventional art, it is difficult to improve the light blocking performance of the light blocking unit. This may result in generation of noise.

Exemplary embodiments of an imaging apparatus according to the present disclosure will be described in detail below. Components similar throughout the drawings are designated by the same reference signs, and the descriptions of redundant components are occasionally omitted. Further, the following exemplary embodiments exemplify an aspect of the present disclosure, and the present invention is not limited to the following exemplary embodiments.

[Pixel Circuit]

Figure 1:
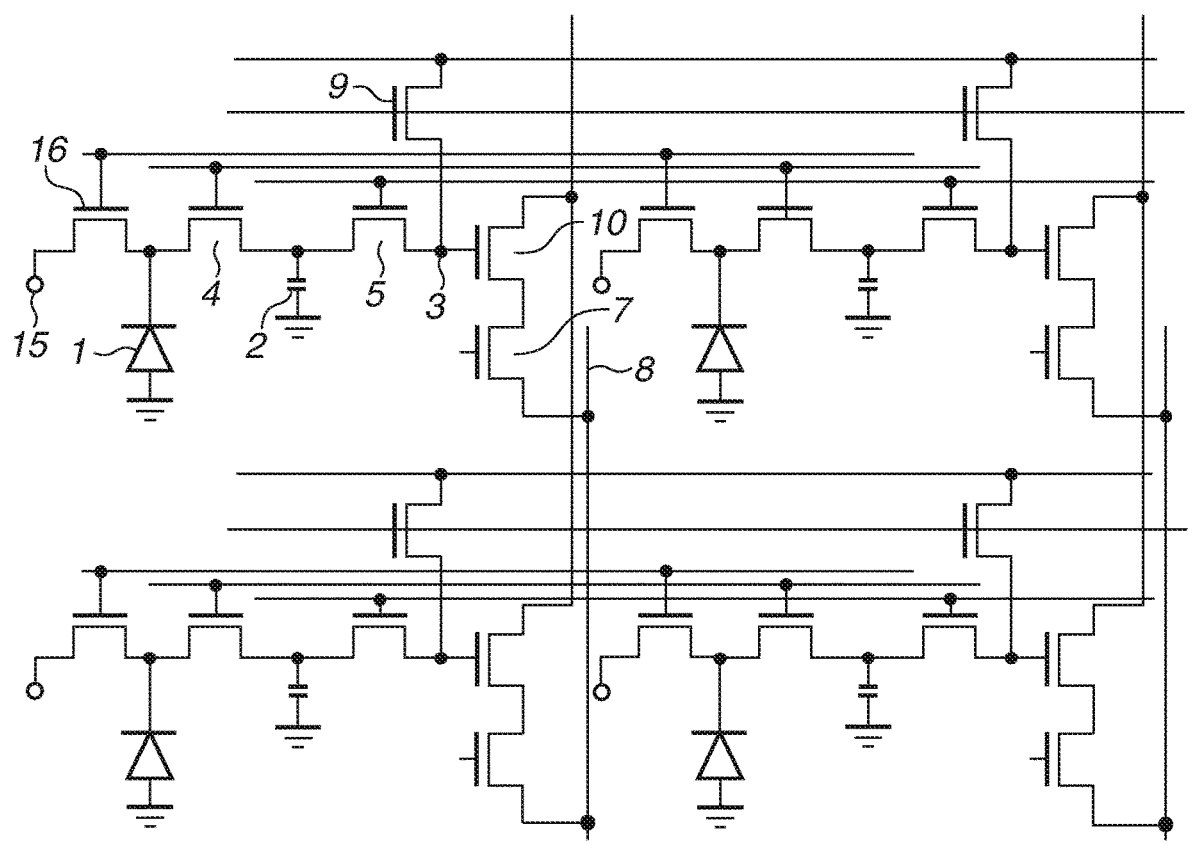
FIG. 1 is a diagram illustrating a circuit configuration of a pixel of an imaging apparatus according to a first exemplary embodiment.

FIG. 1 is a diagram illustrating the circuit configuration of a pixel according to a first exemplary embodiment. The pixel is an element for converting light incident thereon into an electric signal. A plurality of pixels are arranged in a matrix, thereby forming a pixel array. The pixels are formed on a semiconductor substrate made of silicon (Si).

Each pixel includes a photoelectric conversion unit 1, a charge holding unit 2, a floating diffusion (FD) unit 3, and an overflow drain (OFD) unit 15. The pixel further includes a first transfer transistor 4, a second transfer transistor 5, a selection transistor 7, a reset transistor 9, an amplification transistor 10, and an OFD transistor 16, which switch the connections and disconnections between these units or amplify a signal. Each transistor is composed of a metal-oxide-semiconductor field-effect transistor (MOSFET). For example, each transistor includes drain and source terminals and a gate electrode (a gate terminal) for controlling conduction between the drain and source terminals. The selection transistor 7 of each pixel is connected to an output line 8. Typically, a plurality of pixels included in a single column are connected to a single output line 8.

The photoelectric conversion unit 1 generates a signal charge corresponding to the amount of light incident on the photoelectric conversion unit 1. The charge holding unit 2 is connected to the photoelectric conversion unit 1 via the first transfer transistor 4. The first transfer transistor 4 transfers the electric charge of the photoelectric conversion unit 1 to the charge holding unit 2. In an equivalent circuit diagram, the charge holding unit 2 is represented as a grounded capacity or a diode. The charge holding unit 2 temporarily holds the electric charge transferred from the photoelectric conversion unit 1.

The FD unit 3 converts the electric charge transferred from the charge holding unit 2 into a voltage signal. The FD unit 3 is connected to the charge holding unit 2 via the second transfer transistor 5. The second transfer transistor 5 transfers the electric charge of the charge holding unit 2 to the FD unit 3. Further, the FD unit 3 is also connected to the source terminal of the reset transistor 9 and the gate terminal of the amplification transistor 10. A power supply voltage is supplied to the drain terminal of the reset transistor 9. The reset transistor 9 is turned on, thereby resetting the voltage of the FD unit 3 to the power supply voltage.

The amplification transistor 10 outputs a signal corresponding to the voltage of the gate terminal of the amplification transistor 10 to the output line 8. For example, in the state where the voltage of the FD unit 3 is reset to the power supply voltage, the amplification transistor 10 outputs a reset signal. Further, after the transfer transistor 5 is turned on, and the electric charge is transferred from the charge holding unit 2 to the FD unit 3, a pixel signal corresponding to the amount of transferred electric charge is output to the source terminal of the amplification transistor 10.

The source terminal of the amplification transistor 10 is connected to the drain terminal of the selection transistor 7. The source terminal of the selection transistor 7 is connected to the output line 8. If the selection transistor 7 is turned on, the reset signal or the pixel signal is output to the output line 8. In this manner, a signal is read from the pixel.

The photoelectric conversion unit 1 is connected to the OFD unit 15 via the OFD transistor 16. If the OFD transistor 16 is turned on, electric charges accumulated in the photoelectric conversion unit 1 are discharged to the OFD unit 15. Electric charges of all the pixels are simultaneously discharged to the OFD units 15, and then, the accumulated electric charges are transferred to the charge holding units 2, thereby achieving a global electronic shutter for setting simultaneous and uniform exposure times for all the pixels. This suppresses shifts in exposure timings occurring due to the sequential reading of electric charges from the pixels and reduces a distortion in an image. The global electronic shutter operation is an example of a driving method applicable to an imaging apparatus according to the present exemplary embodiment. The imaging apparatus according to the present exemplary embodiment may only perform a rolling shutter operation.

[Pixel Structure]

Figure 2:
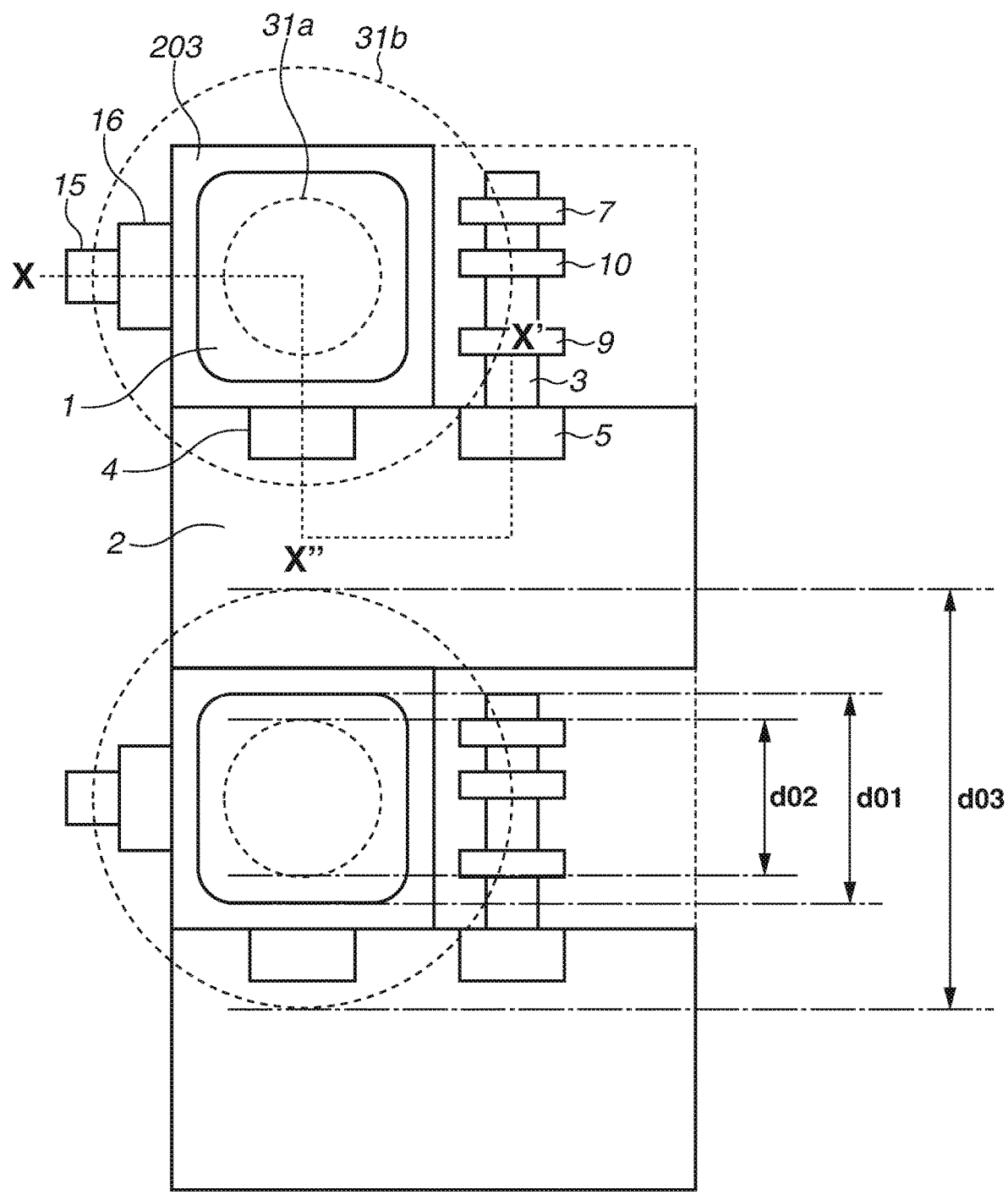
FIG. 2 is a diagram schematically illustrating a planar structure of the pixel of the imaging apparatus according to the first exemplary embodiment.
Figure 3:
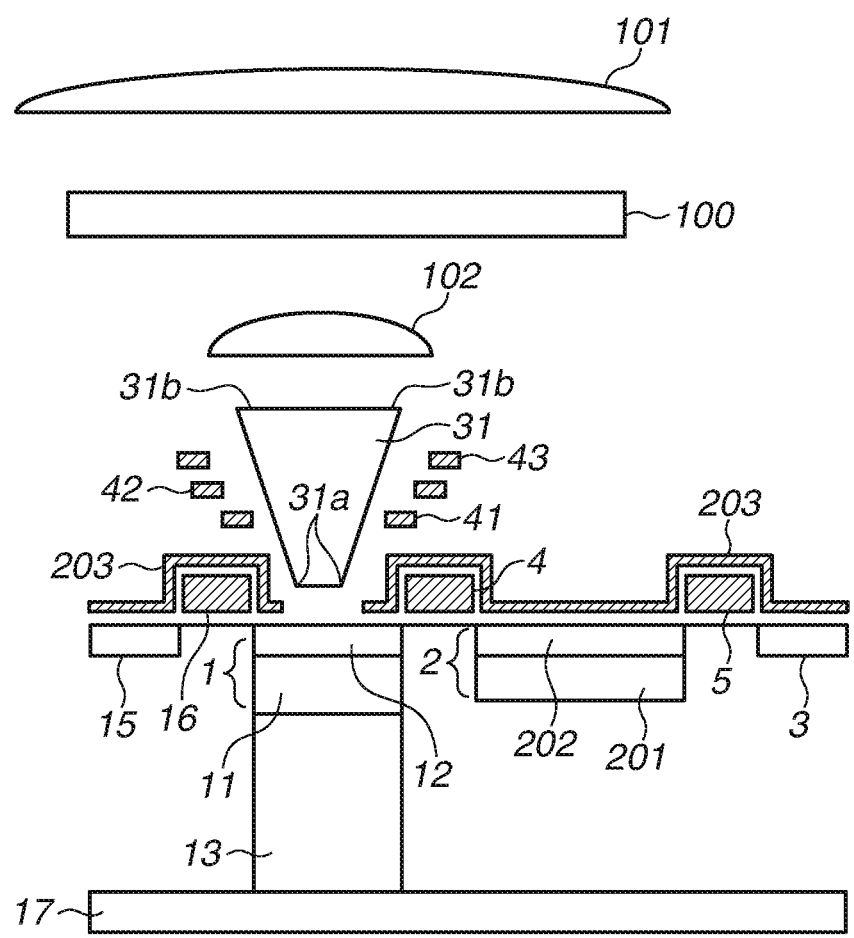
FIG. 3 is a diagram schematically illustrating a cross-sectional structure of the imaging apparatus according to the first exemplary embodiment.
Figure 4A:
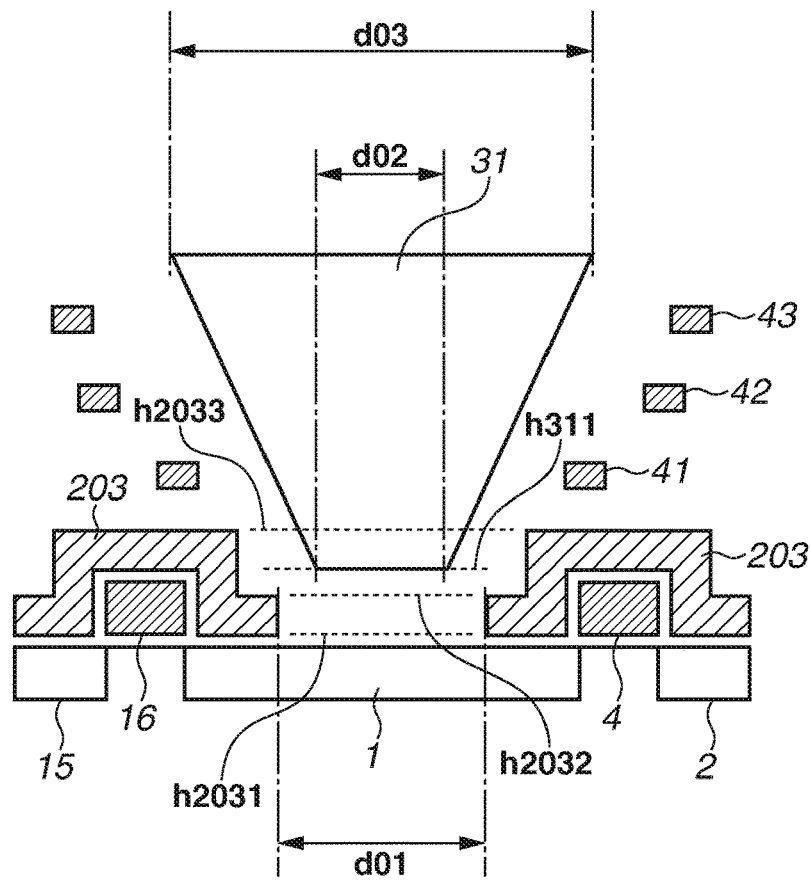
FIGS. 4A and 4B are diagrams schematically illustrating the cross-sectional structure of the imaging apparatus according to the first exemplary embodiment.
Figure 4B:
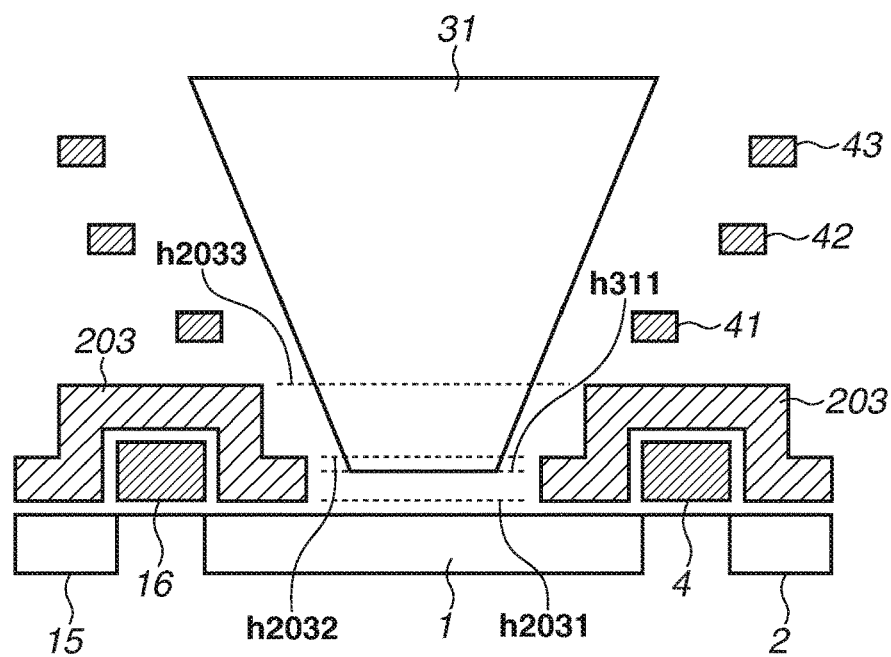

FIG. 2 is a diagram schematically illustrating the planar structure of the pixel according to the first exemplary embodiment. FIG. 2 is a plan view of the surface of the substrate on which the photoelectric conversion unit 1 and the like are disposed. The surface of the substrate is, for example, a surface on which a semiconductor material such as silicon is in contact with an insulator material. FIG. 3 is a diagram schematically illustrating a cross-sectional structure along X-X' in FIG. 2. FIGS. 4A and 4B are partially enlarged views of FIG. 3. Portions corresponding to those of the circuit in FIG. 1 are designated by the same signs, and the descriptions of already described configurations and functions are occasionally omitted. The signs corresponding to the transistors refer to the gate electrodes (the gate terminals) of the respective transistors.

As illustrated in FIG. 2, the photoelectric conversion unit 1 is disposed between the charge holding unit 2 in the same pixel and the charge holding unit 2 in a pixel adjacent to this pixel. Thus, the photoelectric conversion units 1 and the charge holding units 2 are alternately arranged along a first direction (the vertical direction in FIG. 2). Meanwhile, the photoelectric conversion unit 1 and a region where the FD unit 3, the OFD unit 15, and the transistors are disposed are arranged along a second direction intersecting the first direction.

With reference to FIG. 3, the structures of the photoelectric conversion unit 1 and the charge holding unit 2 will be described. The photoelectric conversion unit 1 includes a first semiconductor region 11 of a first conductivity type and a second semiconductor region 12 of a second conductivity type. The second semiconductor region 12 is formed in contact with the surface of the substrate. The first semiconductor region 11 is placed immediately below the second semiconductor region 12. Hereinafter, the description is given on the assumption that the first conductivity type is an n-type, and the second conductivity type is a p-type. These types, however, may be reversed. A junction interface between the first semiconductor region 11 and the second semiconductor region 12 forms a P-N junction. The P-N junction interface is inside the substrate and not in contact with the surface of the substrate. That is, the photoelectric conversion unit 1 is a buried photodiode. In a buried-type structure, the P-N junction interface is buried in the substrate. Thus, the influence of noise on the surface of the substrate is suppressed.

A third semiconductor region 13 of an n-type is further formed immediately below the first semiconductor region 11. The impurity concentration of the third semiconductor region 13 is lower than the impurity concentration of the first semiconductor region 11. Consequently, electrons photoelectrically converted by the third semiconductor region 13 can be collected in the first semiconductor region 11. Alternatively, the third semiconductor region 13 may be of a p-type.

A fourth semiconductor region 17 is formed below the third semiconductor region 13. The fourth semiconductor region 17 extends to the regions of the charge holding unit 2 and the FD unit 3. The fourth semiconductor region 17 is a p-type semiconductor region. The fourth semiconductor region 17 serves as a potential barrier for an electron generated in the photoelectric conversion unit 1 and has the function of suppressing the leakage of the electron to the substrate.

The charge holding unit 2 includes a fifth semiconductor region 201 of an n-type and a sixth semiconductor region 202 of a p-type. The sixth semiconductor region 202 is formed in contact with the surface of the substrate. The fifth semiconductor region 201 is placed immediately below the sixth semiconductor region 202. Similarly to the photoelectric conversion unit 1, the charge holding unit 2 has a buried-type structure. Thus, it is possible to suppress the accumulation of electric charges generated on the surface of the substrate as noise in the charge holding unit 2. Alternatively, the charge holding unit 2 can also be formed by omitting the sixth semiconductor region 202 and placing only the fifth semiconductor region 201. In this case, the gate electrode of the first transfer transistor 4 extends to cover the charge holding unit 2, and a negative potential is applied to the gate electrode to induce a hole on the surface, whereby it is possible to suppress noise generated at the interface.

[Optical System and Wiring Structure]

As illustrated in FIG. 3, a color filter 100, a microlens 101, an interlayer lens 102, and a waveguide 31 are placed as an optical system above the photoelectric conversion unit 1. Light incident from above the photoelectric conversion unit 1 sequentially passes through the microlens 101, the color filter 100, the interlayer lens 102, and the waveguide 31 and is incident on the photoelectric conversion unit 1. The light incident on the photoelectric conversion unit 1 is converted into an electron. The imaging apparatus includes lines 41, 42, and 43, which are used to transmit signals. The lines 41, 42, and 43 are formed of a highly conductive material such as aluminum or copper. The lines 41, 42, and 43 are placed around the waveguide 31. Although portions between members such as the interlayer lens 102, the waveguide 31, the lines 41, 42, and 43, and the photoelectric conversion unit 1 are illustrated as spaces in FIG. 3, an interlayer insulating layer (not illustrated) or a planarization layer (not illustrated) is formed in these space portions.

The microlens 101 and the interlayer lens 102 can concentrate light incident thereon on the photoelectric conversion unit 1. As a result, it is possible to improve sensitivity. The color fitter 100 is a thin film for selectively transmitting light of a particular wavelength. With the color fitter 100, it is possible to obtain an image signal including color information.

The waveguide 31 has the function of concentrating light incident thereon on the photoelectric conversion unit 1. The waveguide 31 increases the amount of light to be incident on the photoelectric conversion unit 1. Thus, it is possible to improve the sensitivity as compared with a case where the waveguide 31 is not included. Particularly, in a case where the area of the photoelectric conversion unit 1 is small, or the F-number is large, the problem of a reduction in the sensitivity may arise. In response to this, the waveguide 31 is provided, whereby it is possible to suppress the influence of this problem.

The waveguide 31 includes an upper surface (an incidence portion) which is opposed to the interlayer lens 102 and on which light is incident, and a bottom surface (an exit portion) which is opposed to the photoelectric conversion unit 1 and from which light is emitted. In the present exemplary embodiment, the bottom surface of the waveguide 31 is a contact surface between a member forming the waveguide 31 and a member disposed below the waveguide 31. The member disposed below the waveguide 31 is, for example, an etch stopper layer or an interlayer insulating layer. Further, in the present exemplary embodiment, the upper surface of the waveguide 31 is a contact surface between the member forming the waveguide 31 and a member disposed above the waveguide 31. Above the waveguide 31, an interlayer insulating layer or a planarization layer is disposed. In the cross section illustrated in FIG. 3, the width of the upper surface of the waveguide 31 is greater than the width of the bottom surface of the waveguide 31. That is, in this cross section, the waveguide 31 has a trapezoidal shape.

As illustrated in FIG. 2, an end portion 31b of the upper surface and an end portion 31a of the bottom surface of the waveguide 31 are circular. In FIG. 2, "d02" represents the width of the waveguide 31 at the bottom surface of the waveguide 31. Further, "d03" represents the width of the waveguide 31 at the upper surface of the waveguide 31. In the present exemplary embodiment, since the shapes of the upper and bottom surfaces of the waveguide 31 are circular, each of the widths of the waveguide 31 at the upper and bottom surfaces of the waveguide 31 corresponds to the diameter of a circle. Each of the shapes of the upper and bottom surfaces of the waveguide 31 may be an ellipse, a square, a rectangle, or a polygon. In a case where the shape of the upper or bottom surface is an ellipse, the width of the waveguide 31 corresponds to the length of the major axis of the ellipse. In a case where the shape of the upper or bottom surface includes two sides parallel to each other as in a square, a rectangle, or a regular hexagon, the width of the waveguide 31 is the distance between the two parallel sides, or the length of a line segment passing through the center of gravity and two diagonal vertices. In the case of another shape, the width of the waveguide 31 is the length of the longest line segment among line segments passing inside the waveguide 31 and having both ends in end portions of the upper or bottom surface.

In the present exemplary embodiment, as the material of each interlayer insulating layer between the lines 41, 42, and 43, a silicon dioxide film (SiO) having a refractive index of approximately 1.5 is used. As the material of the waveguide 31, a silicon nitride film (SiN) having a refractive index of approximately 2.0 is used. Light obliquely incident at a predetermined angle on the interface between the waveguide 31 and the interlayer insulating layer is totally reflected by the interface. Thus, the light propagates in the waveguide 31 without leaking to the interlayer insulating layer and is guided to the photoelectric conversion unit 1.

The materials of the interlayer insulating layer and the waveguide 31 are not limited to the combination of a silicon dioxide film and a silicon nitride film. The materials only need to be combined so that the refractive index of the waveguide 31 is higher than the refractive index of the interlayer insulating layer. Thus, any materials can be selected. For example, the interlayer insulating layer may be formed of a silicon dioxide film, and the waveguide 31 may be formed of a silicon oxynitride film (SiON) having a refractive index of approximately 1.8. Alternatively, an organic film material or a material obtained by mixing titanium oxide particles in an organic film material may be used for the waveguide 31. The interlayer insulating layer may be formed of a laminated film composed of different materials. In this case, the refractive index of the waveguide 31 may be configured to be higher than the volume average refractive index of the interlayer insulating layer around the waveguide 31.

The inclination angle of a side wall of the waveguide 31 can be determined by Snell's law. For example, if the refractive index of the waveguide 31 is 1.9, and the refractive index of the interlayer insulating layer is 1.46, light incident at an angle of incidence of 50.2 degrees or more with respect to a perpendicular to the side wall of the waveguide 31 is totally reflected. For example, if the angle of the side wall of the waveguide 31 is 39.8 degrees or less with respect to a direction vertical to the substrate, the leakage of light incident perpendicularly on the waveguide 31 is suppressed, and the light reaches the photoelectric conversion unit 1. The greater the ratio of the refractive index of the waveguide 31 to that of the interlayer insulating layer, the wider the range of the angle of incidence at which light can be totally reflected. This improves the degree of freedom in designing the angle of the side wall.

A reflection prevention layer may be included in the optical path of incident light between the upper surface of the waveguide 31 and the interlayer lens 102 or between the bottom surface of the waveguide 31 and the photoelectric conversion unit 1. The loss of the amount of light due to reflection is reduced, and the transmittance of incident light is improved. Thus, it is possible to improve the sensitivity.

[Structure of Light Blocking Unit]

As illustrated in FIG. 3, the imaging apparatus further includes a light blocking unit 203, which covers at least a part of the charge holding unit 2. It is desirable that the light blocking unit 203 should be placed to cover the charge holding unit 2 and the gate electrode of the first transfer transistor 4. It is more desirable that the light blocking unit 203 should cover a region other than that immediately above the photoelectric conversion unit 1. The light blocking unit 203 suppresses the incidence of light on the charge holding unit 2. This suppresses the generation of an electric charge in the charge holding unit 2 by incident light which leads to generation of noise.

The light blocking unit 203 can be formed using a material less likely to transmit visible light, such as tungsten, tungsten silicide, a tungsten oxide film, aluminum, or an alloy film of these materials. The film thickness of the light blocking unit 203 is, for example, approximately 100 to 200 nm. The light blocking unit 203 is collectively formed, including a portion where the gate electrodes are placed and a portion where the gate electrodes are not placed. Thus, the light blocking unit 203 includes depressions and protrusions caused by the film thicknesses of the gate electrodes.

The light blocking unit 203 includes an aperture immediately above the photoelectric conversion unit 1 so that a portion other than the photoelectric conversion unit 1 is shielded from light, while the photoelectric conversion unit 1 is irradiated with light. A part of the light blocking unit 203 may be disposed above an end portion of the photoelectric conversion unit 1. In FIG. 2, "d01" represents the width of the aperture of the light blocking unit 203. In the example illustrated in FIG. 2, the width of the aperture of the light blocking unit 203 is the distance between end portions of the aperture of the light blocking unit 203 in the direction along which the two charge holding units 2 are arranged. In a case where end portions of the aperture of the light blocking unit 203 include two sides parallel to each other, then as illustrated in FIG. 2, the distance between the two sides may be the width of the aperture of the light blocking unit 203.

[Detailed Description of Waveguide]

FIGS. 4A and 4B are diagrams illustrating the positional relationship between the light blocking unit 203 and the waveguide 31 in the present exemplary embodiment. FIGS. 4A and 4B are diagrams schematically illustrating a cross-sectional structure along X-X" in FIG. 2 and are enlarged views of a portion near the photoelectric conversion unit 1 in FIG. 3.

In FIGS. 4A and 4B, dotted lines h2031, h2032, h2033, and h311 indicate the distances between the light blocking unit 203 and the waveguide 31, and the surface of the substrate (the heights of the light blocking unit 203 and the waveguide 31 from the surface of the substrate). For example, the dotted line h311 means that the position of the bottom surface (the exit portion) of the waveguide 31 has the height h311. In the following descriptions, an expression "the height of the bottom surface of the waveguide 31 is h311" will occasionally be used with this sign.

In a region where the gate electrodes are not placed, the distance between the light blocking unit 203 and the surface of the substrate (the height of the light blocking unit 203 from the surface of the substrate) is h2031. In the region where the gate electrodes are not placed, the height of the upper surface of the light blocking unit 203 is h2032. The height of the upper surface of the light blocking unit 203 in the portion formed above the gate electrodes is h2033. It is desirable that the distance h311 from the surface of the substrate to the waveguide 31 should be longer than the distance h2031 from the surface of the substrate to the light blocking unit 203. In the present exemplary embodiment, the height h311 of the bottom surface of the waveguide 31 is between the heights h2032 and h2033.

If the distance h311 from the surface of the substrate to the waveguide 31 is shorter than the distance h2031 from the surface of the substrate to the light blocking unit 203, light emitted from the bottom surface of the waveguide 31 may spread due to diffraction and be incident on the charge holding unit 2. If the light is incident on the charge holding unit 2, an electric charge is generated in the charge holding unit 2 and can cause noise. In contrast, in the present exemplary embodiment, the bottom surface of the waveguide 31 is at a position higher than the height h2031 of the lower end of the light blocking unit 203. Thus, even if light emitted from the bottom surface of the waveguide 31 spreads due to diffraction, the light is blocked by the light blocking unit 203. This can reduce or prevent the incidence of light on the charge holding unit 2. Thus, it is possible to suppress the generation of noise.

FIG. 4B is a diagram illustrating a variation of the positional relationship between the waveguide 31 and the light blocking unit 203. The configuration illustrated FIG. 4B is different from the configuration illustrated in FIG. 4A in the position of the bottom surface of the waveguide 31.

In FIG. 4B, the height h311 of the bottom surface of the waveguide 31 is between the height h2031 of the lower end of the light blocking unit 203 and the height h2032 of the upper surface of the light blocking unit 203 in the region where the gate electrodes are not placed. In this case, light emitted from the bottom surface of the waveguide 31 and diffracted is reflected by the side surfaces of the light blocking unit 203. Thus, similarly to the above case, it is possible to reduce or prevent the incidence of light on the charge holding unit 2. Thus, it is possible to suppress the generation of noise. The light reflected by the side surfaces of the light blocking unit 203 can be incident on the photoelectric conversion unit 1. A component to be reflected by the upper surface of the blocking unit 203 decreases, and the amount of light to be reflected by the side surfaces of the light blocking unit 203 and collected in the photoelectric conversion unit 1 increases. Thus, it is possible to obtain higher sensitivity.

Next, with reference to FIG. 4A, a description will be given of the width of the waveguide 31, the width of the aperture of the light blocking unit 203, and the relationship between these widths in the present exemplary embodiment. In the specification, when the relationship between the width of the waveguide 31 and the width of the aperture of the light blocking unit 203 is mentioned, each width is measured on the same straight line. Thus, for example, the widths of the waveguide 31 and the aperture of the light blocking unit 203 are measured in a cross section including the waveguide 31 and the aperture of the light blocking unit 203, whereby it is possible to identify the relationship between these widths.

First, the width d02 of the bottom surface of the waveguide 31 will be described. The width d02 of the bottom surface of the waveguide 31 is set to a value less than approximately 1.1 µm (micrometers), or the width d02 of the bottom surface of the waveguide 31 is set to approximately 32.0% or less of a pixel pitch (a pixel size). Specifically, in the present exemplary embodiment, the pixel pitch is approximately 3.4 µm, and the width d02 of the bottom surface of the waveguide 31 in the present exemplary embodiment is approximately 0.8 µm.

The present inventors have found that it is possible to improve the light blocking performance of the light blocking unit 203 by making the width d02 of the bottom surface of the waveguide 31 small. The effects of this improvement in the light blocking performance will be described.

FIG. 5A illustrates a simulation indicating the relationship between the size of the waveguide 31 and the sensitivity. FIG. 5B illustrates a simulation indicating the relationship between the size of the waveguide 31 and the light blocking performance. In each of FIGS. 5A and 5B, the horizontal axis represents the width d02 of the bottom surface (the exit portion) of the waveguide 31, and the vertical axis represents the width d03 of the upper surface (the incidence portion) of the waveguide 31. Both FIGS. 5A and 5B are standardized such that the numerical value of the highest evaluation is 100%. The sensitivity is the ratio of the amount of light incident on the photoelectric conversion unit 1 to the amount of light incident on the imaging apparatus. The light blocking performance is the ratio between the amount of light incident on the photoelectric conversion unit 1 and the amount of light incident on the charge holding unit 2 when a certain amount of light is incident on the imaging apparatus.

Main conditions used in the simulations in FIGS. 5A and 5B are as follows. The wavelength of incident light is 550 nm. The angle of incidence of light is 0 degrees. The height of the waveguide 31 is 2.0 µm. The pixel pitch is 3.4 µm. The width of the photoelectric conversion unit 1 is 1.65 µm. The width d01 of the aperture of the light blocking unit 203 is 1.3 µm.

From FIG. 5A, it is understood that if the width d02 of the bottom surface of the waveguide 31 is around 1.1 µm, high sensitivity is obtained. As illustrated in FIG. 5B, however, to improve the light blocking performance, it is desirable that the width d02 of the bottom surface of the waveguide 31 should be smaller than 1.1 µm. In the present exemplary embodiment, if the width d02 of the bottom surface of the waveguide 31 is 1.1 µm or more, the light blocking performance is approximately 40% of the best value. It is considered that one of the reasons is that the distance between the bottom surface of the waveguide 31 and the charge holding unit 2 is short, and therefore, light emitted from the waveguide 31 is likely to be incident on the charge holding unit 2.

In the present exemplary embodiment, the pixel pitch (the pixel size) is approximately 3.4 µm. If the pixel pitch becomes large, the maximum value of the width d02 of the bottom surface of the waveguide 31 for obtaining desirable light blocking performance changes. As a result of examination, the present inventors have found that if the width d02 of the bottom surface of the waveguide 31 is approximately 32.0% or less of the pixel pitch, it is possible to improve the light blocking performance. For example, in an exemplary embodiment where the pixel pitch is 3.8 µm, and the width d02 of the bottom surface of the waveguide 31 is approximately 1.2 µm, it is possible to obtain high light blocking performance. As a matter of course, if the pixel pitch is approximately 3.8 µm, and the width d02 of the bottom surface of the waveguide 31 is smaller than 1.1 µm, it is possible to improve the light blocking performance.

On the other hand, if the pixel pitch is smaller than 3.0 µm, it is possible to improve the light blocking performance even if the width d02 of the bottom surface of the waveguide 31 is greater than 32.0% of the pixel pitch. In an exemplary embodiment where the pixel pitch is small, if the width d02 of the bottom surface of the waveguide 31 is smaller than 1.1 µm, it is possible to improve the light blocking performance.

From the above examination, the present inventors have obtained the knowledge that with a configuration where the width d02 of the bottom surface of the waveguide 31 is smaller than 1.1 µm, or the width d02 of the bottom surface of the waveguide 31 is approximately 32.0% or less of the pixel pitch, it is possible to improve the light blocking performance. In the conventional art, it is considered that an improvement in the sensitivity also optimizes the light blocking performance. However, the desirable size of the waveguide 31 for the light blocking performance is different from a condition appropriate for an improvement in the sensitivity examined in the conventional art. Thus, based on the new knowledge obtained by the present inventors, it is possible to reduce noise generated in the imaging apparatus.

The lower limit of the width d02 of the bottom surface of the waveguide 31 is not particularly limited. However, in view of the light-guiding effect due to the localization of light, the width d02 may at least correspond to the wavelength of visible light. For example, it is desirable that the width d02 of the bottom surface of the waveguide 31 should be 0.7 µm or more.

Next, the desirable relationship between the width d02 of the bottom surface and the width d03 of the upper surface of the waveguide 31 will be described. First, in the cross section in FIG. 3, the angle between a straight line connecting the end portion 31a of the bottom surface and the end portion 31b of the upper surface of the waveguide 31 and the surface of the substrate is referred to as a "taper angle". If the side surface of the waveguide 31 is perpendicular to the surface of the substrate, the taper angle is 90 degrees.

To further improve the light blocking performance, it is desirable that the taper angle should be 65 degrees or more. It is more desirable that the taper angle should be 68 degrees or more. If the taper angle is small, light incident on the waveguide 31 may leak out of the waveguide 31. This is because light reaching the side surface of the waveguide 31 at an angle greater than a critical angle increases. The light leaking from the waveguide 31 can be reflected by the lines and incident on the charge holding unit 2. This may result in a decrease in the light blocking performance.

For example, as illustrated in FIG. 5B, if the taper angle is 65 degrees or more, generally, the value of the light blocking performance is 40% or more of the best value. If the width d02 of the bottom surface of the waveguide 31 is 0.8 µm, and the width d03 of the upper surface of the waveguide 31 is 2.5 µm, the taper angle is approximately 66.8 degrees. According to the simulation, the light blocking performance at this time was approximately 40% of the best value. If the taper angle is 68 degrees or more, generally, the value of the light blocking performance is 60% or more of the best value. If the width d02 of the bottom surface of the waveguide 31 is 0.8 µm, and the width d03 of the upper surface of the waveguide 31 is 2.4 µm, and also if the width d02 of the bottom surface of the waveguide 31 is 0.9 µm, and the width d03 of the upper surface of the waveguide 31 is 2.5

µm, the taper angle is approximately 68.0 degrees. In these cases, the light blocking performance was around 60% of the best value.

The upper limit of the desirable range of the taper angle varies depending on the performance to be prioritized. To facilitate the formation process of the waveguide 31, it is desirable that the taper angle should be 80 degrees or less. This is because the closer to 90 degrees the taper angle is, the more easily the waveguide 31 is formed. Thus, to achieve both the light blocking performance and the facilitation of the formation process of the waveguide 31, it is desirable that the taper angle should be included in the range from 65 degrees to 80 degrees.

The upper limit of the taper angle may be determined in terms of the light blocking performance. Specifically, if the taper angle is 74 degrees or less, it is possible to improve the light blocking performance. It is more desirable that the taper angle should be 72 degrees or less. If the taper angle is close to 90 degrees, the width d03 of the upper surface (the incidence portion) of the waveguide 31 becomes small. Thus, the amount of light to be incident on the waveguide 31 may decrease. Light not incident on the waveguide 31 can be reflected by the lines and incident on the charge holding unit 2. This may result in a decrease in the light blocking performance.

For example, as illustrated in FIG. 5B, if the taper angle is 74 degrees or less, generally, the value of the light blocking performance is 40% or more of the best value. If the width d02 of the bottom surface of the waveguide 31 is 1.0 µm, and the width d03 of the upper surface of the waveguide 31 is 2.2 µm, the taper angle is approximately 73.2 degrees. According to the simulation under these conditions, the light blocking performance was approximately 40% of the best value. Further, if the width d02 of the bottom surface of the waveguide 31 is 1.0 µm, and the width d03 of the upper surface of the waveguide 31 is 2.3 µm, the taper angle is approximately 71.9 degrees. In this case, the light blocking performance was approximately 60% of the best value.

To sum up, to prioritize an improvement in the light blocking performance, it is desirable that the taper angle should be included in the range from 65 degrees to 74 degrees. Consequently, generally, it is possible to obtain the light blocking performance that is approximately 40% or more of the best value. It is more desirable that the taper angle should be included in the range from 68 degrees to 72 degrees. Consequently, generally, it is possible to obtain the light blocking performance that is approximately 60% or more of the best value.

In the conventional art, typically, only the sensitivity of a waveguide is evaluated. The sensitivity can be improved by making the width d03 of the upper surface of the waveguide 31 large. In response to this, the present inventors have obtained the new knowledge that if the width d03 of the upper surface of the waveguide 31 is too large, the light blocking performance may decrease. This can improve the light blocking performance as compared with the conventional art.

The inclusion of the taper angle in a predetermined range is a method additionally employed to further improve the light blocking performance. Even if the taper angle is not included in the above range, it is still possible to improve the light blocking performance as compared with the conventional art.

If attention is paid to the width d03 of the upper surface of the waveguide 31, it is desirable that the width d03 of the upper surface should be included in the range from approximately 2.1 µm to approximately 2.6 µm. As can be understood from the simulation result in FIG. 5B, if the width d03 of the upper surface of the waveguide 31 is included in the above range, it is possible to obtain relatively high light blocking performance. It is more desirable that the width d03 of the upper surface of the waveguide 31 should be included in the range from approximately 2.2 µm to approximately 2.3 µm. Further, as a result of examining the relationship between the width d03 of the upper surface of the waveguide 31 and the pixel pitch (the pixel size), it is understood that it is desirable that the width d03 of the upper surface of the waveguide 31 should be included in the range from approximately 60% to approximately 77% of the pixel pitch.

Next, the width d01 of the aperture of the light blocking unit 203 will be described. It is desirable that the difference between the width d01 of the aperture of the light blocking unit 203 and the width d02 of the bottom surface of the waveguide 31 should be 0.3 µm or more. In the present exemplary embodiment, for example, the width d01 of the aperture of the light blocking unit 203 is approximately 1.3 µm, and the width d02 of the bottom surface of the waveguide 31 is approximately 0.8 µm. The bottom surface (the exit portion) of the waveguide 31 is distant from the end of the aperture, and therefore, it is possible to reduce the possibility that light emitted from the waveguide 31 is incident on the charge holding unit 2.

In the plan view in FIG. 2, it is desirable that the distance between the end portion 31a of the bottom surface of the waveguide 31 and the charge holding unit 2 should be 0.8 µm or more. The further away the exit portion of the waveguide 31 and the charge holding unit are from each other, the higher light blocking performance can be obtained. Typically, the gate electrode of the first transfer transistor 4 is disposed between the photoelectric conversion unit 1 and the charge holding unit 2. In this case, the distance between the end portion 31a of the bottom surface of the waveguide 31 and the end of the gate electrode on the charge holding unit 2 side should be 0.8 µm or more.

In the plan view in FIG. 2, the distance between the photoelectric conversion unit 1 and the charge holding unit 2 may be 0.5 µm or more. According to such a configuration, it is easy to electrically separate the photoelectric conversion unit 1 and the charge holding unit 2 from each other appropriately. Further, the photoelectric conversion unit 1 is a region on which light should be incident, while the charge holding unit 2 is a region which should be shielded from light. Thus, the further away the photoelectric conversion unit 1 and the charge holding unit 2 are from each other, the more advantageous it is to improve the light blocking performance.

As illustrated in the plan view in FIG. 2, the photoelectric conversion unit 1 is disposed between two charge holding units 2. With such a layout, the effects of an improvement in the light blocking performance by making the width d02 of the bottom surface of the waveguide 31 small are more remarkable.

As described above, in the present exemplary embodiment, the width d02 of the bottom surface of the waveguide 31 is smaller than 1.1 µm, or the width d02 of the bottom surface of the waveguide 31 is 32.0% or less of the pixel pitch. According to such a configuration, it is possible to improve the light blocking performance of the light blocking unit 203.

A second exemplary embodiment will be described. The present exemplary embodiment is different from the first exemplary embodiment in the configurations of the upper and bottom surfaces of the waveguide 31. The differences from the first exemplary embodiment will be mainly described below.

Figure 6:
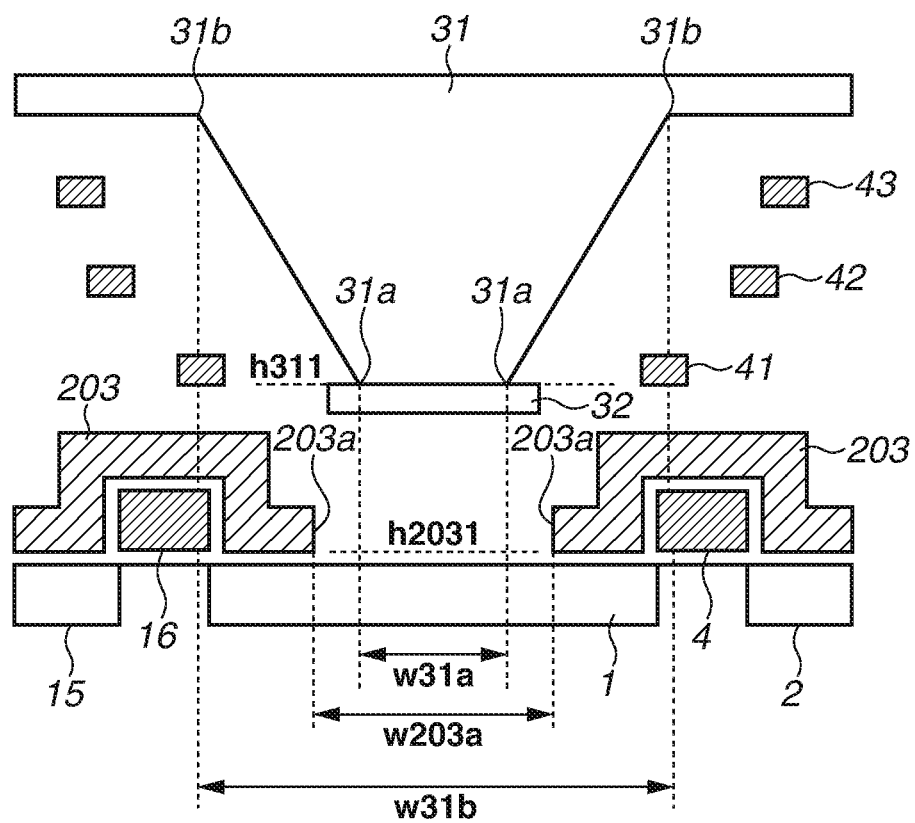
FIG. 6 is a diagram schematically illustrating a cross-sectional structure of an imaging apparatus according to a second exemplary embodiment.

FIG. 6 schematically illustrates the cross-sectional structure of a pixel according to the second exemplary embodiment. FIG. 6 is a cross-sectional view of a portion corresponding to X-X" in FIG. 2. Portions similar to those of the first exemplary embodiment are designated by the same signs, and are not described here.

In FIG. 6, similarly to the first exemplary embodiment, the waveguide 31 includes a portion having a trapezoidal shape in the cross section. Above this portion, a layer extending to outside the waveguide 31 is disposed. The portion having the trapezoidal shape and the layer extending to outside the waveguide 31 can be composed of the same material. That is, the waveguide 31 is formed as a part of a structure having a T-shape in the cross section.

In the present exemplary embodiment, an end portion 31b of the upper surface of the waveguide 31 is a portion where a member forming the waveguide 31 bends between the trapezoid-shaped portion of the waveguide 31 and the layer above the waveguide 31. Thus, in the present exemplary embodiment, "w31b" in FIG. 6 represents the width of the upper surface of the waveguide 31.

Further, in FIG. 6, an etching stop layer (ESL) 32, which is used to form the waveguide 31, is provided on the bottom surface of the waveguide 31. The ESL 32 is a layer for completing an etching process stably at a predetermined depth. The same material as that of the waveguide 31 may be used for the ESL 32. If the ESL 32 has a refractive index equivalent to that of the waveguide 31, the ESL 32 has a light collection effect similarly to the waveguide 31. Thus, it is possible to improve the sensitivity.

In this case, an end portion 31a of the bottom surface of the waveguide 31 is a portion where the member forming the waveguide 31 bends between the trapezoid-shaped portion of the waveguide 31 and the ESL 32. Thus, in the present exemplary embodiment, "w31a" in FIG. 6 represents the width of the bottom surface of the waveguide 31.

In the present exemplary embodiment, the width d02 of the bottom surface of the waveguide 31 is smaller than 1.1 µm, or the width d02 of the bottom surface of the waveguide 31 is 32.0% or less of the pixel pitch. According to such a configuration, similarly to the first exemplary embodiment, it is possible to improve the light blocking performance of the light blocking unit 203.

Similarly to the first exemplary embodiment, the height h311 of the bottom surface of the waveguide 31 is greater than the height h2031 of the lower end of the light blocking unit 203. The effects of this configuration are as described above in the first exemplary embodiment. In addition to this, in the present exemplary embodiment, a width w203a of the aperture of the light blocking unit 203 is greater than the width w31a of the bottom surface of the waveguide 31 and smaller than the width w31b of the upper surface of the waveguide 31. At this time, an end portion 203a of the light blocking unit 203 is located between the end portion 31a of the bottom surface of the waveguide 31 and the end portion 31b of the upper surface of the waveguide 31 as viewed from the optical axis direction of the waveguide 31. According to such a configuration, light output from the bottom surface of the waveguide 31 is less likely to be reflected by the light blocking unit 203. Thus, it is possible to improve the sensitivity.

FIG. 7 is a diagram illustrating the configuration of an imaging system according to a third exemplary embodiment. An imaging system 800 includes an optical unit 810, an imaging apparatus 820, a video signal processing unit 830, a recording/communication unit 840, a timing control unit 850, a system control unit 860, and a reproduction/display unit 870. As the imaging apparatus 820, the imaging apparatus described above in each of the first and second exemplary embodiments is used.

The optical unit 810, which is an optical system such as a lens, forms an image of light from an object on a pixel array of the imaging apparatus 820, in which a plurality of pixels are arranged two-dimensionally, thereby forming an image of the object. At a timing based on a signal from the timing control unit 850, the imaging apparatus 820 outputs a signal corresponding to the light of which the image is formed on the pixels. The signal output from the imaging apparatus 820 is input to the video signal processing unit 830. According to a method determined by a program, the video signal processing unit 830 processes the input signal. The signal obtained by the processing of the video signal processing unit 830 is sent as image data to the recording/communication unit 840. The recording/communication unit 840 sends a signal for forming an image to the reproduction/display unit 870 and causes the reproduction/display unit 870 to reproduce or display a moving image or a still image. Further, the recording/communication unit 840 receives a signal from the video signal processing unit 830 and communicates with the system control unit 860, and also performs the operation recording a signal for forming an image in a recording medium (not illustrated).

The system control unit 860 performs overall control of the operation of the imaging system 800. The system control unit 860 controls the driving of the optical unit 810, the timing control unit 850, the recording/communication unit 840, and the reproduction/display unit 870. Further, the system control unit 860 includes a storage device (not illustrated) such as a recording medium. In the storage device, a program necessary to control the operation of the imaging system 800 is recorded. Further, the system control unit 860 supplies into the imaging system 800, for example, a signal for switching a driving mode according to an operation of a user. Specifically, a signal for switching the driving mode such as changing a row to be read or a row to be reset, changing the angle of view according to electronic zoom, or shifting the angle of view according to electronic image stabilization is supplied. Based on control of the system control unit 860, the timing control unit 850 controls the driving timings of the imaging apparatus 820 and the video signal processing unit 830.

The imaging apparatus 820 according to each of the first and second exemplary embodiments is provided, whereby it is possible to achieve the imaging system 800 in which the generation of noise is suppressed.

Figure 8A:
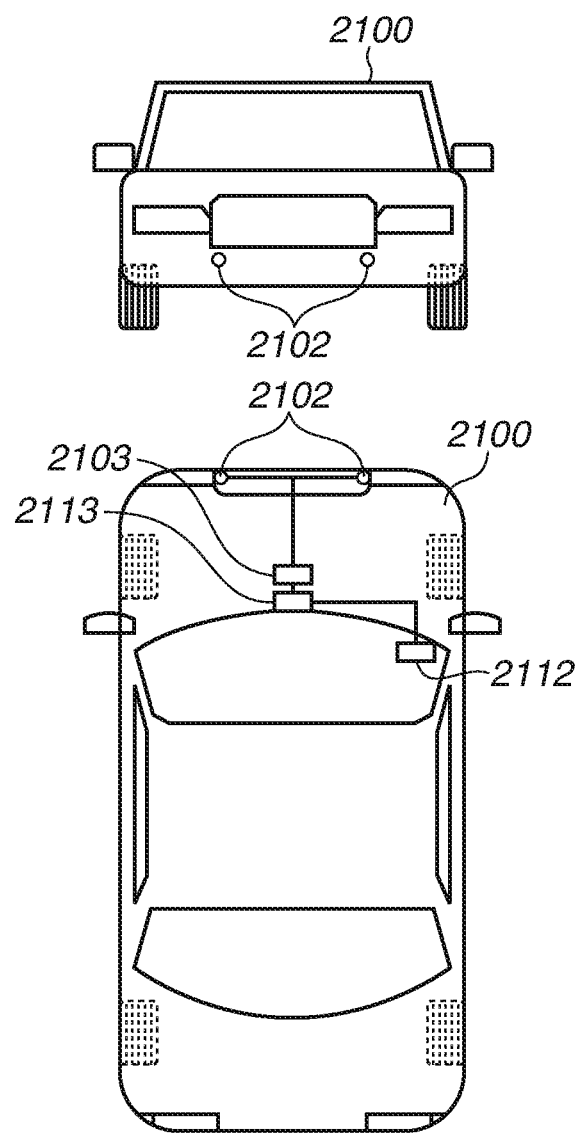
FIG. 8A is a diagram schematically illustrating an external appearance and a main internal structure of an automobile.

A fourth exemplary embodiment regarding a moving body will be described. The moving body according to the present exemplary embodiment is an automobile including an in-vehicle camera. FIG. 8A schematically illustrates the external appearance and the main internal structure of an automobile 2100. The automobile 2100 includes imaging apparatuses 2102, an imaging system integrated circuit (application-specific integrated circuit (ASIC)) 2103, an alarm device 2112, and a main control unit 2113.

As each of the imaging apparatuses 2102, the imaging apparatus described above in each of the exemplary embodiments is used. When the alarm device 2112 receives a signal indicating an abnormality from an imaging system, a vehicle sensor, or a control unit, the alarm device 2112 gives a warning to a driver. The main control unit 2113 performs overall control of the operations of the imaging system, the vehicle sensor, and the control unit. Alternatively, the automobile 2100 may not include the main control unit 2113. In this case, the imaging system, the vehicle sensor, and the control unit each individually includes a communication interface, and transmits and receives a control signal via a communication network (e.g., based on the Controller Area Network (CAN) standard).

Figure 8B:
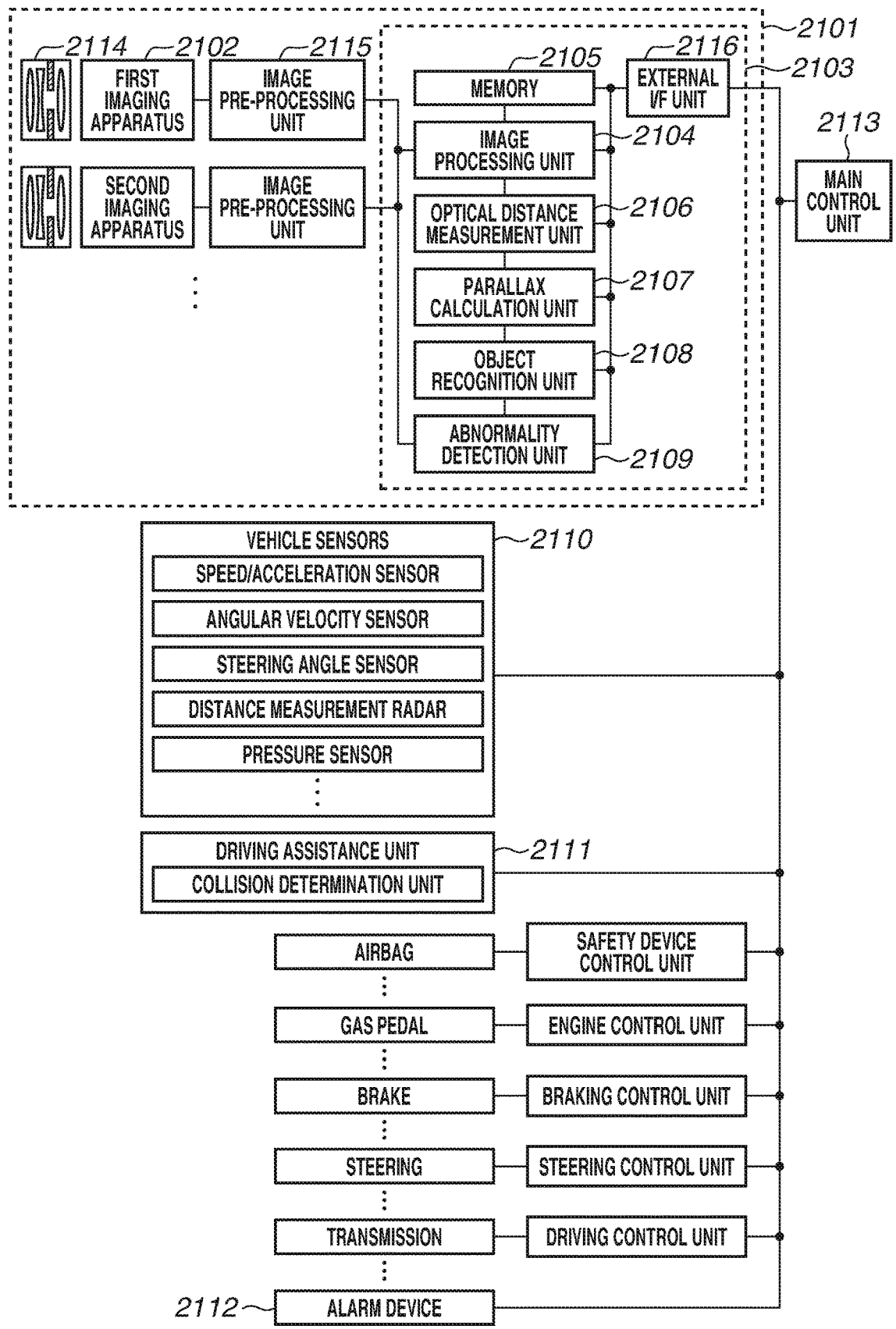
FIG. 8B is a block diagram illustrating a moving body according to a fourth exemplary embodiment.

FIG. 8B is a block diagram illustrating the system configuration of the automobile 2100. The automobile 2100 includes a first imaging apparatus 2102 and a second imaging apparatus 2102. That is, the in-vehicle camera according to the present exemplary embodiment is a stereo camera. In the imaging apparatuses 2102, object images are formed by optical units 2114. Pixel signals output from the imaging apparatuses 2102 are processed by image pre-processing units 2115 and then transmitted to the imaging system integrated circuit 2103. The image pre-processing units 2115 perform processing such as signal-to-noise (S-N) calculation and synchronization signal addition.

The imaging system integrated circuit 2103 includes an image processing unit 2104, a memory 2105, an optical distance measurement unit 2106, a parallax calculation unit 2107, an object recognition unit 2108, an abnormality detection unit 2109, and an external interface (I/F) unit 2116. The image processing unit 2104 processes the pixel signals, thereby generating an image signal. Further, the image processing unit 2104 corrects the image signal or complements an abnormal pixel. The memory 2105 temporarily holds the image signal. Further, the memory 2105 may store the position of an abnormal pixel of a known imaging apparatus 2102. The optical distance measurement unit 2106 focuses on the object or measures the distance from the object using the image signal. The parallax calculation unit 2107 verifies the object in parallax images (stereo matching). The object recognition unit 2108 analyzes the image signal, thereby recognizing the object such as an automobile, a person, a sign, or a road. The abnormality detection unit 2109 detects a breakdown or a malfunction of each of the imaging apparatuses 2102. If detecting a breakdown or a malfunction, the abnormality detection unit 2109 sends to the main control unit 2113 a signal indicating that an abnormality is detected. The external I/F unit 2116 mediates the transmission and reception of information between the components of the imaging system integrated circuit 2103 and the main control unit 2113 or various control units.

The automobile 2100 includes a vehicle information acquisition unit 2110 and a driving assistance unit 2111. The vehicle information acquisition unit 2110 includes vehicle sensors such as a speed/acceleration sensor, an angular velocity sensor, a steering angle sensor, a distance measurement radar, and a pressure sensor.

The driving assistance unit 2111 includes a collision determination unit. Based on information from the optical distance measurement unit 2106, the parallax calculation unit 2107, and the object recognition unit 2108, the collision determination unit determines whether there is a possibility of collision with a physical object. The optical distance measurement unit 2106 and the parallax calculation unit 2107 are examples of a distance information acquisition means for acquiring distance information of the distance from a target object. That is, the distance information is information regarding the parallax, the amount of defocus, and the distance from the target object. Using any of these pieces of distance information, the collision determination unit may determine the possibility of collision. The distance information acquisition means may be achieved by exclusively designed hardware, or may be achieved by a software module.

An example has been described where the driving assistance unit 2111 controls the automobile 2100 so as not to collide with another physical object. Alternatively, the present exemplary embodiment is also applicable to control for automated driving of the automobile 2100 by following another vehicle, or control for automated driving of the automobile 2100 so as to stay in a lane.

The automobile 2100 further includes driving units for use in running, such as an airbag, a gas pedal, a brake, steering, and a transmission. Further, the automobile 2100 includes control units for these driving units. Based on a control signal from the main control unit 2113, each control unit controls the corresponding driving unit.

The imaging system used in the present exemplary embodiment can be applied not only to an automobile but also to a moving body (a moving apparatus) such as a vessel, an aircraft, or an industrial robot. Additionally, the imaging system can be applied not only to a moving body but also to a device widely using object recognition, such as an intelligent transportation system (ITS).

As described above, in the exemplary embodiment regarding the automobile, the imaging apparatus according to either of the first and second exemplary embodiments is used as each of the imaging apparatuses 2102. According to such a configuration, it is possible to suppress the generation of noise.

While the present disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-104934, filed May 26, 2017, which is hereby incorporated by reference herein in its entirety.

What is claimed is:

1. An imaging apparatus comprising:
a plurality of pixels each including a photoelectric conversion unit and a charge holding unit configured to hold an electric charge generated in the photoelectric conversion unit;
a waveguide disposed above the photoelectric conversion unit; and
a light blocking unit configured to cover the charge holding unit,
wherein a width of a bottom surface of the waveguide is smaller than 1.1 µm.

2. The imaging apparatus according to claim 1, wherein an angle between a line connecting an end of the bottom surface of the waveguide and an end of an upper surface of the waveguide and a surface of a substrate on which the photoelectric conversion unit is disposed is 65 degrees or more.

3. The imaging apparatus according to claim 2, wherein the angle is 68 degrees or more.

4. The imaging apparatus according to claim 2, wherein the angle is 80 degrees or less.

5. The imaging apparatus according to claim 2, wherein the angle is 74 degrees or less.

6. The imaging apparatus according to claim 2, wherein the angle is 72 degrees or less.

7. The imaging apparatus according to claim 1, wherein a taper angle between a line connecting an end of the bottom surface of the waveguide and an end of an upper surface of the waveguide and a surface of a substrate on which the photoelectric conversion unit is disposed is 72 degrees or less.

8. The imaging apparatus according to claim 1, wherein a width of an upper surface of the waveguide is included in a range from 2.1 μm to 2.6 μm.

9. The imaging apparatus according to claim 8, wherein the width of the upper surface of the waveguide is included in a range from 2.1 μm to 2.3 μm.

10. The imaging apparatus according to claim 1, wherein a width of an upper surface of the waveguide is included in a range from 60% to 77% of a pixel pitch at which the plurality of pixels are arranged.

11. The imaging apparatus according to claim 1,
wherein an aperture is provided in the light blocking unit at a position above the photoelectric conversion unit, and
wherein a difference between the width of the bottom surface of the waveguide and a width of the aperture is 0.3 μm or more.

12. The imaging apparatus according to claim 1, wherein, in a plan view of a surface of a substrate on which the photoelectric conversion unit is disposed, a distance between an end of the bottom surface of the waveguide and the charge holding unit is 0.8 μm or more.

13. The imaging apparatus according to claim 1, wherein, in a plan view of a surface of a substrate on which the photoelectric conversion unit is disposed, a distance between the photoelectric conversion unit and the charge holding unit is 0.5 μm or more.

14. An imaging system comprising:
the imaging apparatus according to claim 1; and
a processing apparatus configured to process a signal output from the imaging apparatus, thereby acquiring an image signal.

15. A moving body comprising:
the imaging apparatus according to claim 1;
a processing apparatus configured to process a signal output from the imaging apparatus; and
a control unit configured to control the moving body based on a result of the processing.

16. An imaging apparatus comprising:
a plurality of pixels each including a photoelectric conversion unit and a charge holding unit configured to hold an electric charge generated in the photoelectric conversion unit;
a waveguide disposed above the photoelectric conversion unit; and
a light blocking unit configured to cover the charge holding unit,
wherein a width of a bottom surface of the waveguide is 32.0% or less of a pixel pitch at which the plurality of pixels are arranged.

17. The imaging apparatus according to claim 16, wherein an angle between a line connecting an end of the bottom surface of the waveguide and an end of an upper surface of the waveguide and a surface of a substrate on which the photoelectric conversion unit is disposed is 65 degrees or more and 80 degrees or less.

18. The imaging apparatus according to claim 17, wherein the angle is 68 degrees or more and 72 degrees or less.

19. The imaging apparatus according to claim 17, wherein a width of the upper surface of the waveguide is included in a range from 2.1 μm to 2.6 μm.

20. The imaging apparatus according to claim 17, wherein a width of the upper surface of the waveguide is included in a range from 60% to 77% of the pixel pitch at which the plurality of pixels are arranged.

21. The imaging apparatus according to claim 16,
wherein an aperture is provided in the light blocking unit at a position above the photoelectric conversion unit, and
wherein a difference between the width of the bottom surface of the waveguide and a width of the aperture is 0.3 μm or more.

22. The imaging apparatus according to claim 16, wherein, in a plan view of a surface of a substrate on which the photoelectric conversion unit is disposed, a distance between an end of the bottom surface of the waveguide and the charge holding unit is 0.8 μm or more.

23. The imaging apparatus according to claim 16, wherein, in a plan view of a surface of a substrate on which the photoelectric conversion unit is disposed, a distance between the photoelectric conversion unit and the charge holding unit is 0.5 μm or more.

24. An imaging system comprising:
the imaging apparatus according to claim 16; and
a processing apparatus configured to process a signal output from the imaging apparatus, thereby acquiring an image signal.

25. A moving body comprising:
the imaging apparatus according to claim 16;
a processing apparatus configured to process a signal output from the imaging apparatus; and
a control unit configured to control the moving body based on a result of the processing.

* * * * *